(12) United States Patent
Kroell et al.

(10) Patent No.: US 7,194,399 B2
(45) Date of Patent: Mar. 20, 2007

(54) AUTOMATIC CHECK FOR CYCLIC OPERATING CONDITIONS FOR SOI CIRCUIT SIMULATION

(75) Inventors: Karl-Eugen Kroell, Altdorf (DE); Juergen Pille, Stuttgart (DE); Helmut Schettler, Dettenhausen (DE)

(73) Assignee: International Business Machines Corporation, Armonk, NY (US)

( * ) Notice: Subject to any disclaimer, the term of this patent is extended or adjusted under 35 U.S.C. 154(b) by 1320 days.

(21) Appl. No.: 09/902,140

(22) Filed: Jul. 10, 2001

(65) Prior Publication Data

US 2002/0016705 A1    Feb. 7, 2002

(30) Foreign Application Priority Data

Aug. 5, 2000    (EP)  ................. 00116934

(51) Int. Cl.
*G06F 17/50*    (2006.01)
*G06G 7/62*    (2006.01)
(52) U.S. Cl. .................................................. 703/14
(58) Field of Classification Search ............ 703/13–14; 716/1, 4

See application file for complete search history.

(56) References Cited

U.S. PATENT DOCUMENTS

| | | | |
|---|---|---|---|
| 4,918,643 A | 4/1990 | Wong | |
| 5,555,201 A * | 9/1996 | Dangelo et al. | 716/1 |
| 6,063,130 A * | 5/2000 | Sakamoto | 703/14 |
| 6,442,735 B1 * | 8/2002 | Joshi et al. | 716/4 |

OTHER PUBLICATIONS

PCT International Search Report.
Accelerated Steady-State Analysis Technique for PWM DC/DC Switching Regulators, Billy K.H. Wong, IEEE, Henry Chung, IEEE, pp. 759-764, Sep. 11, 1997.
Effect of Body-Charge on Fully- and partially-Depleted SOI MOSFET Design, Melanie J. Sherony, Andy Wei and Dimitri A. Antoniadis, 1996 IEEE.

* cited by examiner

*Primary Examiner*—Hugh Jones
(74) *Attorney, Agent, or Firm*—Steven Capella

(57) ABSTRACT

An improved hardware circuit simulation method in particular for history-dependent and cyclic operation-sensitive hardware circuits, like SOI-type hardware, checks for correct cyclic boundary conditions by performing a first run of a DC simulation with input voltage conditions belonging to CYCLE START, and by carrying out a second DC simulation with input voltage conditions belonging to CYCLE STOP. After comparing the results, e.g., comparing the node voltages, any mismatches can be determined which serve as a hint to non-compatibility with cyclic operation. Thus, the design is able to be re-designed before being simulated in vain with a great amount of work and computing time. A transient simulation can be appended for automated correction of dynamic errors.

8 Claims, 1 Drawing Sheet

AUTOMATIC CHECK FOR CYCLIC OPERATING CONDITIONS FOR SOI CIRCUIT SIMULATION

BACKGROUND OF THE INVENTION

The present invention relates to a method and system for simulating hardware circuits, in particular useful for Silicon-On-Insulator (SOI) type hardware circuits.

It is a general requirement for a computer circuit designer that any kind of computer hardware circuit has to be simulated in order to check for general correctness of circuit structure and function properties, as well as for particularities like, for example, signal propagation times, etc. Thus, over the years of hardware development, many simulation methods have been developed in order to guarantee a high quality of the hardware.

A new technical area of hardware circuit development has now been entered to be explored: SOI-type hardware.

In contrast to conventional CMOS-type hardware, SOI-type hardware states, e.g., the voltages occurring at any node of a circuit, are dependent of the history during which the hardware has been operated. This history-dependent behavior implies a need to apply new simulation and testing methods which are not known from other experience from any type of hardware development. Thus, in SOI, there is a particular interest to test and simulate, i.e., explore hardware states developing after a large number of so-called 'functional cycles'. A functional cycle can be assumed to represent a defined operating interval having a start time and a stop time in which, at both times, the input voltages are the same. A functional cycle may comprise one machine cycle or a plurality of them.

In a computer, many circuits operate in step with the machine cycle. Clock circuits for example do the same operations over and over again. Other circuits typically do not the same thing in each cycle, but they also have to operate reliably under cyclic conditions.

For non-SOI technologies (e.g., conventional CMOS technology), cyclic operating conditions usually do not represent a particular worst case for circuit performance or functionality. Therefore, in the past, not much effort was spent to investigate cyclic operation.

The need for circuit simulation under cyclic operating conditions has significantly increased with the use of partially-depleted SOI technology. With partially-depleted SOI, floating FET bodies cause the so-called "floating body effect" which is a so-called "history effect":

The floating FET bodies need a very long time compared to one operation cycle to adjust to sudden changes in circuit operation, i.e. they "remember" the mode of circuit operation before the change. The state of the body affects the threshold voltage of the FET, and thereby also the switching performance of the circuit. As a result, a circuit behaves differently if it has just been switched on compared to its behavior under prolonged cyclic operation. Therefore, cyclic operating conditions have to be investigated and simulated for circuits in SOI technology.

This phenomenon is accompanied with a further specific, but independent phenomenon which also shows a "history effect". Specifically, in SOI technology, there is a need to investigate circuitry for self-heating because transistors are thermally isolated by the insulator on which they sit. The temperature of a transistor at a given point in time depends on previous switching "history" of the transistor. For obvious reasons, a cyclically operated circuit produces much more self-heating than a circuit which switches only occasionally.

A conventional simulation of such cyclic operation requires the simulation of several thousands of circuit cycles until a steady state of the hardware is approached. Iterative simulation methods are much more efficient, but such methods can also fail or give wrong results if the circuit simulation is not compatible with cyclic operating conditions. Generally, such circuit simulation may require considerable computer resources even if iterative solution methods are used. Errors in the cyclic operating conditions caused by other reasons than the floating-body-effect or by self-heating can lead to convergence problems resulting in excessive computer run times for the simulation. Such simulations often done done in vain, e.g., they may lead to erroneous results or no result at all after several iterations.

There is therefore a need for an improved simulation method and system, in particular for history-dependent and cyclic operation-sensitive hardware circuits, like SOI-type hardware, for example.

SUMMARY OF THE INVENTION

The present invention provides simulation methods and systems which are well applicable to SOI type hardware. For conventional hardware, e.g., CMOS type hardware, however, the concepts of the present invention may be useful as well. Thus, the scope of the present invention is not limited by applying it to SOI.

According to a first aspect of the present invention, a semi-automatic simulation method is provided which allows to check every circuit node if its voltage at CYCLE START matches with its voltage at CYCLE STOP under static (DC) simulation conditions. If not, according to the present invention, a first indication can be obtained which helps to automatically localize and manually correct voltage mismatches which are caused by non-cyclic input voltage waveforms.

The check for correct input voltage waveforms is preferably done by performing a first run of a conventional DC simulation with input voltage conditions belonging to CYCLESTART, and by carrying out a second DC simulation with input voltage conditions belonging to CYCLE STOP. After comparing the results, e.g., comparing the node voltages, any mismatches can be determined which serve as a hint to non-compatibility with cyclic operation. Thus, the input voltage waveforms used in the simulation can be corrected to allow cyclic operation before the circuit is simulated with a great amount of work and computing time.

According to a second aspect of the present invention, after the corrections described above, a transient simulation is appended as a further step. It is carried out from CYCLE START to CYCLE STOP. An automated comparison of the runs can be used to detect errors in the setup of the simulation and to automatically correct such errors which are related to internal circuit nodes, especially floating nodes or metastable circuit nodes, e.g., metastable states of a storage cell. Such errors are referred to as dynamic errors in contrast to the above described static errors found by static (DC) simulations. Thus, dynamic errors can be found very simply and quickly as well in history-dependent hardware circuits.

Further, the automatic check according to the invention can be integrated into iterative simulation programs not even dedicated to SOI alone. This forces and enables the chip designing engineers to eliminate errors from a hardware simulation input file before the run-time-consuming calculations associated with a conventional hardware simulation program may start. Only after having precise knowledge about correct steady-state behavior, a subsequent iterative test run makes sense for history-dependent hardware.

Further, when the simulation START TIME is prior to CYCLE START, array cells or latches can be set between START TIME and CYCLE START. As well, the STOP TIME can be later than CYCLE STOP. Thus, the testing method can easily use input files from non-SOI hardware circuits, i.e., a migration to SOI is facilitated.

Thus, it can be summarized that the above described invention is of advantage for simulations of cyclically operated circuitry, especially in SOI technology. The present invention, however, can be applied to any time-dependent chip technology, i.e., any chip technology which shows time-dependent physical behavior. In such a technology, one or more physical properties of the chip, e.g., the conductivity of particular chip areas, the mobility behavior of the electrical charge carriers, temperature-dependent conductivity behavior or others may be the reason for such time dependence.

Without the checking procedure of the invention, the circuit input netlist may contain errors which, if they remain undetected, may disturb simulations, cost a lot of computer simulation time and lead to wrong, possibly misleading results.

Thus, a search by hand for errors in the cyclic operating conditions, which is often time-consuming and uncertain especially for large circuits, can be avoided according to the present invention.

BRIEF DESCRIPTION OF THE DRAWINGS

The present invention is illustrated by way of example and is not limited by the shape of the FIGURE of the accompanying drawing which is a schematic block diagram showing the basic steps of the control flow according to a preferred embodiment of the present invention.

DETAILED DESCRIPTION OF THE INVENTION

Figure 1:
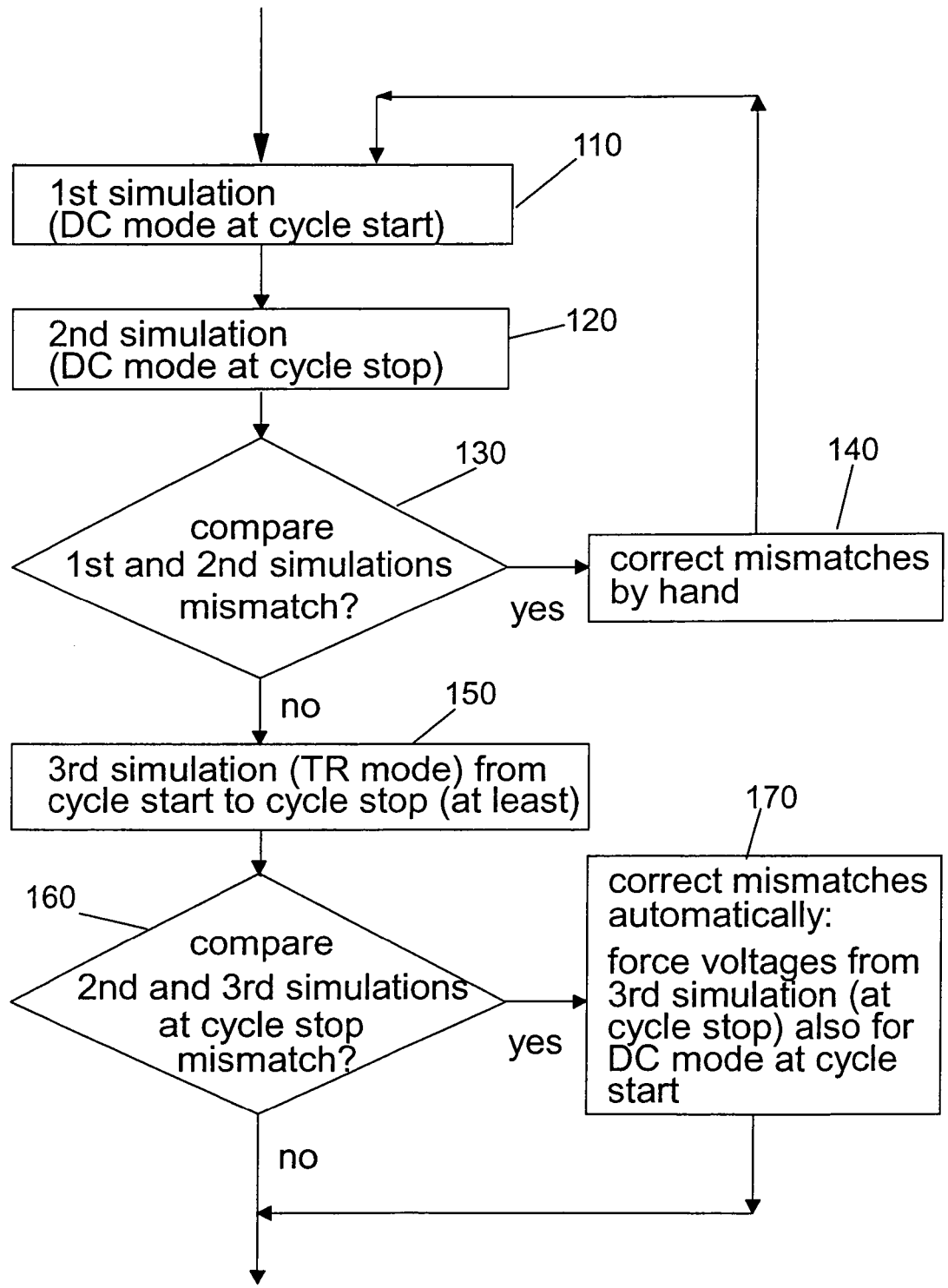

With reference to the FIGURE, the control flow according to a preferred embodiment of the present invention is described in more detail next below.

In a first step 110, a first DC simulation is performed with input voltages belonging to CYCLE START. This is done by setting the simulation START TIME equal to CYCLE START. In particular, a predetermined, associated input voltage pattern is coupled with the circuit model. Then, the static (i.e., stable) end state for each node which does not vary anymore in time is taken for evaluation. Transient values are not considered at this moment.

Then all stable node voltages are stored for later comparisons.

Then, in a step 120, a second DC simulation is carried out with input voltage conditions which belong to CYCLE STOP. This is done by setting the simulation START TIME equal to CYCLE STOP. Here, as well, input voltage pattern associated to CYCLE STOP is coupled with the circuit model, and all node voltages are stored as well.

Of course, further data may be stored as well, for example the transistor temperatures which belong to the above described simulation conditions.

In a step 130, the results from the two preceding DC simulation runs are compared for each node. The compare process compares e.g., the voltages found on every node of interest in the simulation circuit.

In the YES-branch of step 130, at least one mismatch is found. A mismatch is defined when the voltage difference at a node between the two runs is more than a predetermined threshold value, for example, 0.01 Volts with a total voltage difference between supply voltage, $V_{dd}$, and ground of 1.8 Volts.

According to the present invention, a conclusion can now be drawn from that mismatch. Specifically, a mismatch indicates a non-compatibility with cyclic test operation such that it makes no sense to run further cyclic operation simulation runs as long as input voltage waveforms showing error behavior have not been corrected.

A further, detailed comparison gives information regarding which circuit nodes/input voltages do not comply. This comparison can be automated to list only the mismatches together with corresponding circuit node identification data. By that, the circuit designer is enabled to efficiently find the error location and to correct it, step 140. An automated correction is not possible at this stage because any computer program cannot know the input voltage waveforms which a designer had in mind to complete the cycle.

Then it is branched back to step 110 in order to repeat the procedure.

The steps 110 to 130 described above do not cost much computing time compared to a transient simulation. Up to this point, the checking method detects all non-cyclic external stimulations of the circuit. It does not necessarily detect, however, non-cyclic behavior of internal circuit nodes as they were mentioned further above.

Therefore, a third simulation can advantageously appended in the NO-branch of step 130, i.e., when no static errors were found.

Thus, after correction of all static errors which are exposed by the two previous checks in steps 110 to 140, or in case of no static errors being present from the straight beginning, in step 150, a transient simulation is run which covers the time span between CYCLE START and CYCLE STOP.

It should be added that the START TIME can also be prior to CYCLE START in order to set array cells or latches between START TIME and CYCLE START, and that the STOP TIME can be later than CYCLE STOP. Thus, the testing method can easily use input files from non SOI-hardware circuits, i.e., a migration to SOI is facilitated.

Then, in a step 160, the voltages at CYCLE STOP are compared with the corresponding voltages from the first or the second DC simulation step, step 110, or 120, respectively. A more relaxed mismatch criterion (e.g., 0.2 V) should now be taken for the decision mismatch/no mismatch. In case no mismatch is found, the test method has completed; the hardware model has neither static nor dynamic error nodes and the corresponding piece of hardware can thus actually be manufactured, at least from the point of view relevant for the purposes the present invention is handling.

In the YES-branch, when mismatches are found from the transient simulation of step 150, the underlying problem at a respective node is usually caused by one of the following three circumstances:

a.) Switching Delays of Internal Circuit Nodes

Typically, a circuit simulator initializes a transient simulation automatically by a preceding DC simulation, assuming the transient simulation starts at CYCLE START and stops at CYCLE STOP. Then, at CYCLE START, the simulation begins with the results of the DC initialization and proceeds in transient mode until it ends at CYCLE STOP. Under these conditions, a node voltage waveform would not necessarily end up with the same voltage at CYCLE STOP which it started from at CYCLE START. For example, a wordline restore pulse of a memory array may be delayed so much at CYCLE STOP that it does not recover it's original clean switching level which it had under DC initialization at CYCLE START.

b.) Metastable Circuit Nodes

An example for metastable nodes are the cell nodes of a 6-Device memory array cell. The DC simulation calculates the metastable state of a cell. With the same initialization assumptions for the transient run as in a.), the nodes are in a metastable state at CYCLE START, i.e., the node voltage is undefined somewhere between ground and supply voltage $V_{dd}$. Later on, the nodes switch to a stable state prior to CYCLE STOP, either ground or supply voltage with the consequence of a cell content being 0 or 1, and will remain in this state afterwards. This is then a drastic violation of cyclic boundary conditions. To overcome this problem, a cell has to be initialized in DC mode if the transient simulation starts at CYCLE START.

c.) Floating Circuit Nodes

A typical example of a floating node is the node between two shut-off transistors in series bias. The two transistors are assumed to be NFET1 and NFET2, with NFET1 hanging between nodes GND (ground) and F, NFET2 between nodes F and supply voltage $V_{dd}$. It is further assumed that both NFET1 and NFET2 are shut off at CYCLE START, and that NFET1 switches ON for some time between CYCLE START and CYCLE STOP and returns to OFF again at CYCLE STOP. With the same DC initialization assumptions for the transient run as in a.), node F is in a floating state at CYCLE START, both transistors OFF and node F therefore floating somewhere between ground and supply voltage. During the transient simulation, NFET1 switches ON and node F is pulled to ground. Node F will essentially remain at that level up to the end of the simulation at CYCLE STOP although NFET1 switches OFF again. Similar to case b.), this is a drastic violation of cyclic boundary conditions.

It should be noted that the above described static violations of cyclic boundary conditions as well as the dynamic violations of cases a.), b.) and c.) are not specific to SOI technology. Therefore the present invention is also applicable to non-SOI technologies. In fact, in this case the next transient analysis after the checking and error correction of this invention can be considered to be a cyclic simulation.

As reveals from the above description, the three typical cases a., b., c. are examples which can be detected with the inventive testing method.

According to the present invention, an automatic correction of dynamic errors can be appended in a program implementing the before-described steps by initializing the node voltages in a step 170 to the same values at CYCLE START which the run had ended with at CYCLE STOP. This can be done with the use of so-called cover models which replace the usual transistor simulation models. From the outside, such cover models have the same name and the same nodes as the normal transistor simulation models, but inside, they have additional properties, e.g., the capability to initialize the transistor nodes to desired voltages, which means to force these desired voltages at the begin of a transient simulation.

This forcing can be done in DC simulation mode only. Since a transient simulation is initialized by a DC-simulation, the forcing then becomes effective only at the beginning of a transient simulation. The actual simulations of the cyclic behavior can then start at CYCLE START and end at CYCLE STOP.

With the use of cover models, the input netlist for the simulation stays exactly the same as for use with usual models.

As could be seen from the above description, by step 170, the model mismatches can be corrected automatically. Thus, the testing method can be successfully completed after detecting and correcting dynamic errors as well.

As already mentioned above the transient simulation, step 150 does not necessarily have to start at CYCLE START or stop at CYCLE STOP as long as it covers a wider range. This has the additional advantage that the circuit designer can set array cells and latches into the desired 0 or 1 state already prior to CYCLE START and use transient simulation mode for this purpose. This is the usual practice for technologies other than SOI. In that case, it is not required to set the cells/latches in DC mode at CYCLE START. This helps to migrate circuit simulation input files from other technologies to SOI.

The above described testing method exemplified by steps 110 to 170 can be programmed for automatic execution. Such a program can be written to be executable from within a conventional circuit simulator environment. It can communicate with the simulator, e.g. start simulations, take data from simulations, evaluate and modify them and feed them back to subsequent simulations. For the IBM ASX/POWER SPICE simulators, such a program is called a GODATA MACRO. For the context of this invention, the GODATA MACRO can start the two DC-runs, make the comparison and in case of mismatch, print out the transistor and node identification and discontinue.

This gives the circuit designer a chance to check the error messages and correct the netlist. If no errors are found after the two DC runs, the macro can continue with the transient run and make the additional comparison with one of the DC-runs. This will identify dynamic violations as described above under a.) b.) c.).

If the check is automated, it can be easily integrated with iterative solution methods which address the behavior of floating bodies under cyclic operating conditions in SOI technology. The check can be made prior to the actual start of iterations. In case of errors which can not be corrected automatically, the job can be programmed to be aborted prior to the iterations. This saves a lot of faulty iterative simulations which otherwise would take place. Faulty simulation input files lead to convergence problems, incorrect results and may not be even recognized as incorrect. Even if they are suspected to be incorrect, it is rather difficult to judge the magnitude, i.e., the importance of incorrectness. This holds especially for very large circuits.

In the foregoing specification, the invention has been described with reference to a specific exemplary embodiment thereof. It will, however, be evident that various modifications and changes may be made thereto without departing from the broader spirit and scope of the invention as set forth in the appended claims. The specification and drawing are accordingly to be regarded as illustrative rather than in a restrictive sense.

The present invention can be realized in hardware, software, or a combination of hardware and software. Any kind of computer system or other apparatus adapted for carrying out the methods described herein is suited. A typical combination of hardware and software could be a general purpose computer system having a hardware simulation platform installed thereon, or, a hardware testing computer system, respectively, with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context means any expression, in any language, code or notation, of a set of instructions intended to cause a system having an information processing capability to perform a particular function either directly or after either or both of the following: a) conversion to another language, code or notation; b) reproduction in a different material form.

What is claimed is:

1. A method for simulating hardware circuits during which voltages are calculated at a plurality of circuit nodes, comprising the steps of:
    (a) carrying out a first DC-simulation run at the beginning of a functional cycle,
    (b) carrying out a second DC-simulation run at the end of said cycle,
    (c) comparing simulated values from both runs at respective circuit nodes, and
    (d) storing mismatch information about static error afflicted nodes at which the calculated values differ by more than a predetermined first threshold value.

2. The method according to claim 1 further comprising the steps of:
    (e) outputting said mismatch information for a manual correction,
    (f) carrying out a transient analysis covering the same functional cycle after correction,
    (g) comparing calculated values from said analysis with calculated values from said first or second DC simulation run at respective circuit nodes, and
    (h) storing mismatch information about dynamic error afflicted nodes at which the calculated values differ by more than a predetermined second threshold value.

3. The method according to claim 1 comprising the step of selling the START TIME prior to the begin of a functional cycle.

4. The method according to claim 1 in which the hardware is built according to silicon-an insulator (SOI) technology.

5. A computer system having installed program means comprising program code portions for performing the steps:
    (a) carrying out a first DC-simulation run at the beginning of a functional cycle,
    (b) carrying out a second DC-simulation run at the end of said cycle,
    (c) comparing simulated values from both runs at respective circuit nodes, and
    (d) storing mismatch information about static error afflicted nodes at which the calculated values differ by more than a predetermined first threshold value.

6. The computer system according to claim 5 further comprising program code portions for performing the steps:
    (e) outputting said mismatch Information for a manual correction,
    (f) carrying out a transient analysis covering the same functional cycle after correction,
    (g) comparing calculated values from said analysis with calculated values from said first or second DC simulation run at respective circuit nodes, and
    (h) storing mismatch information about dynamic error afflicted nodes at which the calculated values differ by more than a predetermined second threshold value.

7. Computer program product stored on a computer-readable medium, said product comprising code that, when executed, causes a computer to perform the method comprising:
    (a) carrying out a first DC-simulation run at the beginning of a functional cycle,
    (b) carrying out a second DC-simulation run at the end of said cycle,
    (c) comparing simulated values from both runs at respective circuit nodes, and
    (d) storing mismatch information about static error afflicted nodes at which the calculated values differ by more than a predetermined first threshold value.

8. The computer program product according to claim 7 wherein said method further comprises performing the steps:
    (a) outputting said mismatch information for a manual correction,
    (f) carrying out a transient analysis covering the same functional cycle after correction,
    (g) comparing calculated values from said analysis with calculated values from said first or second DC simulation run at respective circuit nodes, and
    (h) storing mismatch information about dynamic error afflicted nodes at which the calculated values differ by more than a predetermined second threshold value.

* * * * *